(12) United States Patent
Shi et al.

(10) Patent No.: US 6,963,089 B2
(45) Date of Patent: Nov. 8, 2005

(54) AVALANCHE PHOTO-DETECTOR WITH HIGH SATURATION POWER AND HIGH GAIN-BANDWIDTH PRODUCT

(75) Inventors: Jin-Wei Shi, Taipei (TW); Chee-Wee Liu, Taipei (TW)

(73) Assignee: Industrial Technology Research Institute, Chutung (TW)

( * ) Notice: Subject to any disclaimer, the term of this patent is extended or adjusted under 35 U.S.C. 154(b) by 101 days.

(21) Appl. No.: 10/720,117

(22) Filed: Nov. 25, 2003

(65) Prior Publication Data

US 2005/0051861 A1 Mar. 10, 2005

(30) Foreign Application Priority Data

Sep. 9, 2003 (TW) .............................. 92124948 A

(51) Int. Cl.⁷ ........................................... H01L 31/107
(52) U.S. Cl. ..................................... 257/186; 257/438
(58) Field of Search .................... 257/186, 438, 257/21, 22, 432, 615, 616

(56) References Cited

U.S. PATENT DOCUMENTS

| | | | |
|---|---|---|---|
| 5,818,096 A | 10/1998 | Ishibashi et al. | 257/458 |
| 6,222,200 B1 | 4/2001 | Svilans | 257/18 |
| 6,384,462 B1 | 5/2002 | Pauchard et al. | 257/461 |
| 6,459,107 B2 | 10/2002 | Sugiyama et al. | 257/226 |
| 6,465,803 B1 | 10/2002 | Bowers et al. | 257/21 |
| 2005/0029541 A1 * | 2/2005 | Ko | 257/186 |
| 2005/0051861 A1 * | 3/2005 | Shi et al. | 257/438 |

* cited by examiner

Primary Examiner—Mark V. Prenty
(74) Attorney, Agent, or Firm—Bacon & Thomas

(57) ABSTRACT

An avalanche photo-detector (APD) is disclosed, which can reduce device capacitance, operating voltage, carrier transport time and dark current as well as increasing response speed and output power. Thus, an avalanche photo-detector (APD) with high saturation power, high gain-bandwidth product, low noise, fast response, low dark current is achieved. The APD includes an absorption layer with graded doping for converting an incident light into carriers, an undoped multiplication layer for multiplying current by means of receiving carriers, a doped field buffer layer sandwiched between the absorption layer and the multiplication layer for concentrating an electric field in the multiplication layer when a bias voltage is applied, and an undoped drift layer sandwiched between the absorption layer and the field buffer layer for capacitance reduction.

19 Claims, 5 Drawing Sheets

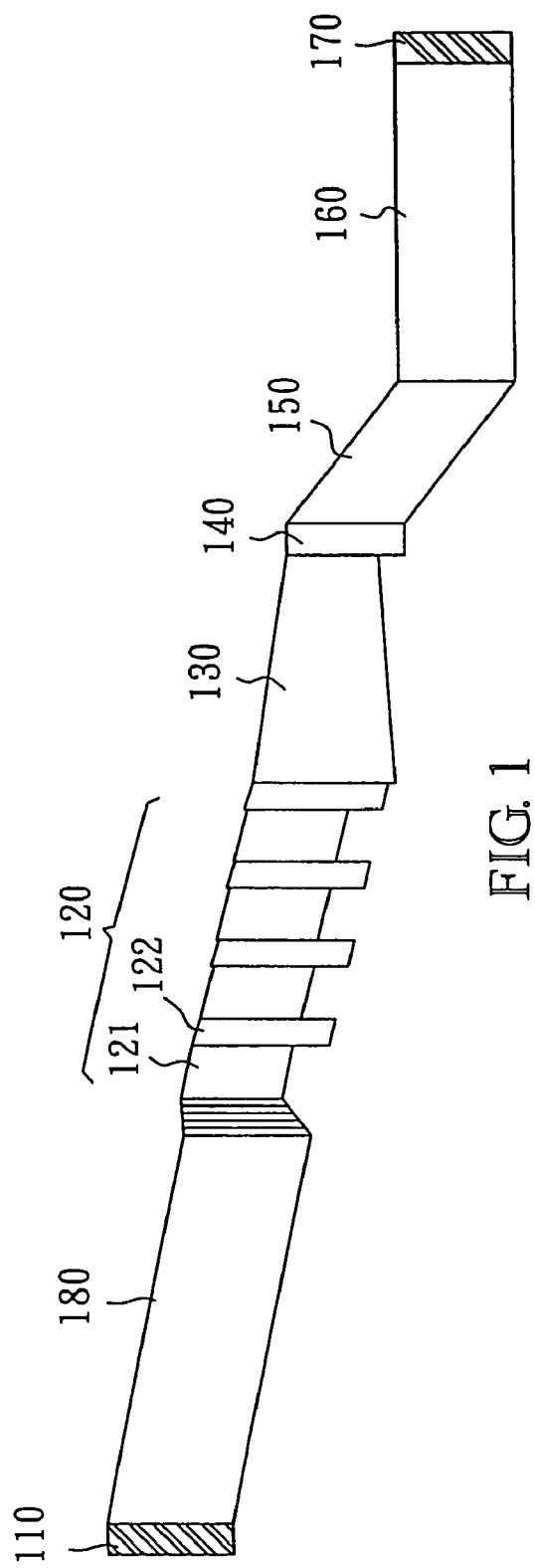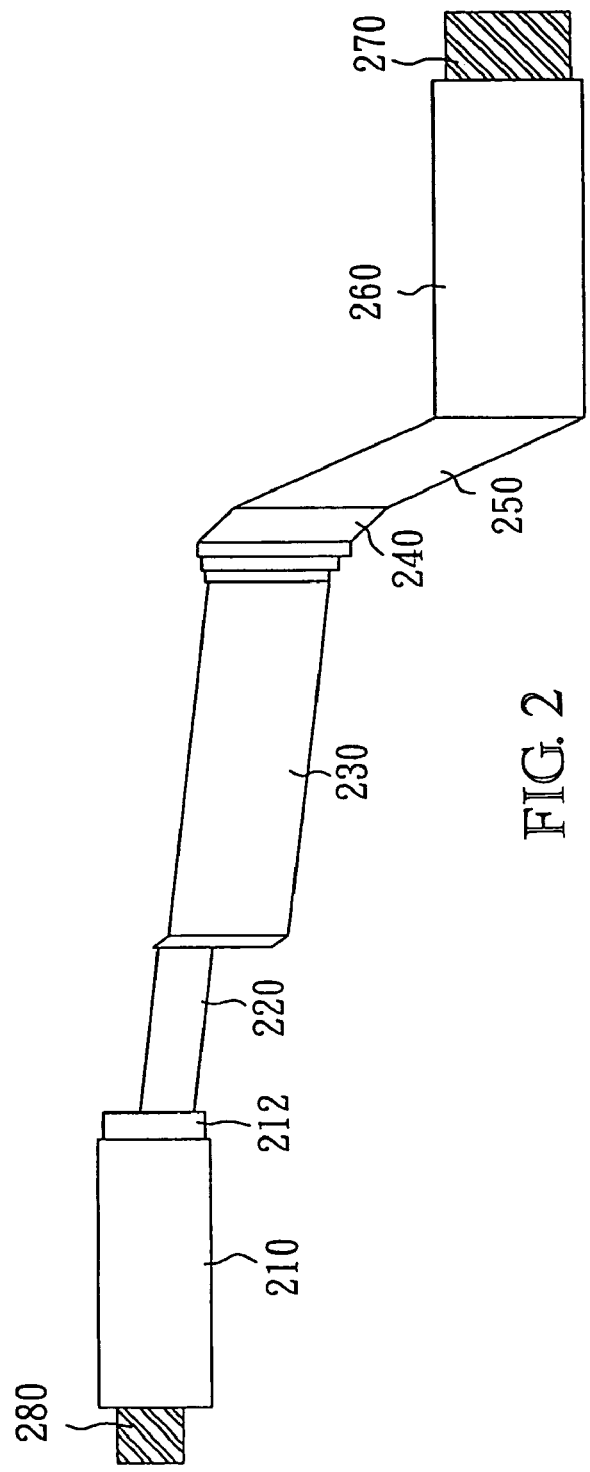
FIG. 1
FIG. 2

AVALANCHE PHOTO-DETECTOR WITH HIGH SATURATION POWER AND HIGH GAIN-BANDWIDTH PRODUCT

BACKGROUND OF THE INVENTION

1. Field of the Invention

The present invention relates to a photodetector and, more particularly, to an avalanche photodetector (APD) adapted for high-speed long-distance optical fiber communication.

2. Description of Related Art

Recently, APDs have become the leading device in photo-receiver market in 2.5 GHz or 10 GHz bandwidth for optical communication. Compared with fast p-i-n photodetectors, APD can provide higher sensitivity and gain in the desired bandwidth. As compared to photo-transistors (HPTs) with the same gain, APDs are preferred in its speed potential and short falling time of impulse response, such that they are more practical in eye-diagram test and commercial optical communication than HPTs do. When a high-speed photo-detector is developed in a market of high-speed long-distance optical fiber communication, two factors of high output power-bandwidth product and high efficiency-bandwidth product need to be met. However, the traditional APDs cannot meet with the two factors at the same time.

The electrons and holes in III-V material have almost the same ionization coefficients when multiplication avalanche occurs. By contrast, in a silicon material, electrons are the dominated carriers for multiplication process (i.e. over 99% of carriers), such that an APD with Si-based substrate has better performance in bandwidth, noise-elimination, and gain performance than an APD with III-V based substrate does. However, the APD with Si-based substrate does not response to any radiation in any wavelength of optical fiber communication due to the relative large bandgap energy of silicon. To overcome this problem, an InGaAs absorption layer is suggested to attach to a Si multiplication layer by wafer bonding, so as to form a separate absorption multiplication APD (SAM APD) (e.g. InGaAs fused Si APD in U.S. Pat. No. 6,465,803). However, such a wafer-bonding device has several disadvantages like high cost, high dark current, and brittleness caused by different heat expansion coefficients between Si and InGaAs. Therefore, another APD structure, applied in optical communication, having a Si multiplication layer and an absorption layer with SiGe alloy is disclosed in U.S. Pat. No. 6,457,107 which provides a novel long wavelength APD with a SiGeC absorption layer. However, such a structure still has high operating voltage and high device capacitance. Further, SiGeC cannot be grown directly into a thicker absorption layer in practical production and application.

Therefore, it is desirable to provide an improved APD to mitigate and/or obviate the aforementioned problems.

SUMMARY OF THE INVENTION

The object of the present invention is to provide an APD formed of IV-based or III-V based materials for reducing device capacitance, operating voltage, carrier transport time and dark current as well as increasing response speed and output power.

To achieve the object of the present invention, an avalanche photo-detector (APD) with high saturation power, high gain-bandwidth product, low noise, fast response, low dark current is provided. The APD of the present invention includes an absorption layer, a multiplication layer, a drift layer sandwiched between the absorption layer and the multiplication layer, and a field buffer layer sandwiched between the drift layer and the multiplication layer. The absorption layer is made of a first semiconductor to absorb incident light for converting the incident light into carriers and is graded heavily doped to produce a built-in electric field and solve the problems of photo-generated hole transport. In traditional APD, the photo-absorption layer is undoped to increase the electric field inside and reduce the transport time of photo-generated hole. However, under high optical power illumination, the photo-generated hole will result in serious bandwidth and output electrical power degradation. The doped photo-absorption layer technique of p-i-n photodetector structure is disclosed in U.S. Pat. No. 5,818,096. By use of the p-type doping in photo-absorption layer, the photo-generated hole can relax to the contact directly and output saturation power can be improved significantly. The multiplication layer is made of an undoped second semiconductor to receive carriers for multiplying current. The field buffer layer is a doped third semiconductor sandwiched between the absorption layer and the multiplication layer for concentrating the electric field in the multiplication layer when a bias voltage is applied. The drift layer is an undoped fourth semiconductor sandwiched between the field buffer layer and the absorption layer for capacitance reduction.

The inventive first, second, third and fourth semiconductors can be III-V based semiconductor, III-V based alloy, IV-based semiconductor, or IV based alloy semiconductor materials. On the other hand, the first semiconductor and the third semiconductor, i.e., the absorption layer and the field buffer layer are preferred to be a first electrical conduction type (such as p type) while a substrate connected to the second semiconductor, i.e., the multiplication layer's substrate is preferred to be a second electrical conduction type (such as n type). The second semiconductor and the fourth semiconductor, i.e., the multiplication layer and the drift layer are preferred to be undoped.

Other objects, advantages, and novel features of the invention will become more apparent from the following detailed description when taken in conjunction with the accompanying drawings.

BRIEF DESCRIPTION OF THE DRAWINGS

FIG. 1 is a view of energy band diagram of an IV alloy material example of Si and SiGe according to the invention;

FIG. 2 is a view of energy band diagram of an III-V alloy material example according to the invention;

DETAILED DESCRIPTION OF THE PREFERRED EMBODIMENT

Figure 3:
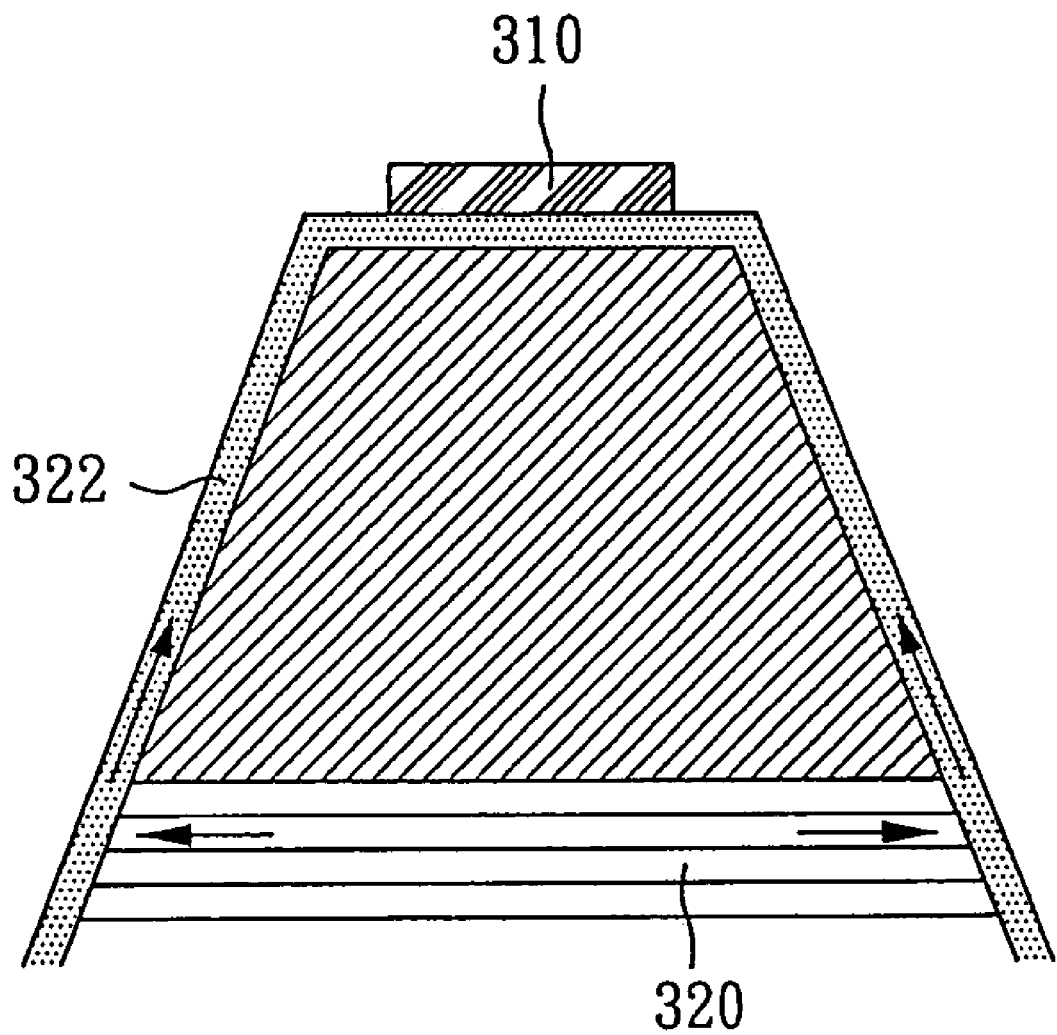
FIG. 3 is a cross-sectional view of an improved structure of FIG. 1 according to the invention.

The inventive APD can optionally include a first conduction layer and a second conduction layer in order to connect and conduct the absorption layer or the multiplication layer. In general, the absorption layer of the APD of the present invention is sandwiched between the first conduction layer and the drift layer. The multiplication layer is sandwiched between the second conduction layer and the field buffer layer. The absorption layer of the APD is graded doped, to produce a built-in electric field. An example of p-type Si absorption layer is given. The doping concentration for the p-type Si absorption layer is gradually reduced from a surface of an epi layer to a bottom of the epitaxy layer. As compared to traditional APD structure, our heavily doped p-type photo-absorption layer will not be depleted during operation, and the photo-generated hole can relax to the contact directly. The APD can also optionally include a t waveguide epi-layer structure. The absorption layer is sandwiched between the cladding layers and the drift layer if the waveguide structure is arranged in APD. The multiplication layer is sandwiched between the second waveguide layer and the field buffer layer. The APD can further optionally include a first multi-layer reflector set and a second multi-layer reflector set. The absorption layer and the multiplication layer are sandwiched between the first and second multi-layer reflector sets. Preferably, the first and second multi-layer reflector sets are sets of distributed Bragg reflectors. The APD can further optionally include a side-wall hole relaxation layer to contact the periphery of the absorption layer and further link the absorption layer and the first conduction layer for catching relaxed holes of the absorption layer to the first conduction layer. Preferably, the relaxation layer is $P^+$—Ge or $P^+$—SiGe. The absorption layer of the APD can be heavily doped or preferably graded doped in order to produce a built-in electric field, thereby speeding up electron transport and shortening electron transport time in the absorption layer. The absorption layer of the APD can be implemented by any III-V based semiconductor, III-V based alloy, IV-based semiconductor, or IV based alloy semiconductor materials. To implement a low-cost Si substrate, the absorption layer preferably uses Si or $Si_xC_{1-x}$ as an energy barrier and $Si_xGe_{1-x}$ as a quantum well or superlattice of energy well, wherein $0<x<1$. Alternatively, the absorption layer also uses Si or $Si_xC_{1-x}$ as an energy barrier or cap layer and Ge as a quantum dot, wherein $0<x<1$. In the APD, the absorption layer, the multiplication layer, the field buffer layer and the drift layer can be IV based semiconductor (i.e. semiconductor of elements of group IV in periodic table) or IV based semiconductor alloy as well as group III-V based semiconductor or III-V based semiconductor alloy. For example, the multiplication layer and the drift layer can be an undoped Si layer and the field buffer layer can be p-type or n-type doped Si layer, or alternately the absorption layer can be p-type InGaAs layer, the drift layer can be undoped InP layer, the field buffer layer can be p-type InAlAs layer and the multiplication layer can be undoped InAlAs layer. The substrate can be n-type InP or an n-type InP semiconductor layer plus a semi-insulating InP substrate. The incident direction of the optical signal in the APD is unlimited, preferably the incident direction of the light and carrier propagation direction are vertical, almost vertical, parallel or almost parallel. The epitaxy structure required for the APD of the present invention can be formed by any conventional process. Preferably, the epitaxy structure is formed by UHV-CVD, LP-CVD or MBE on a semiconductor substrate. A following embodiment is given for better understanding.

Figure 4:
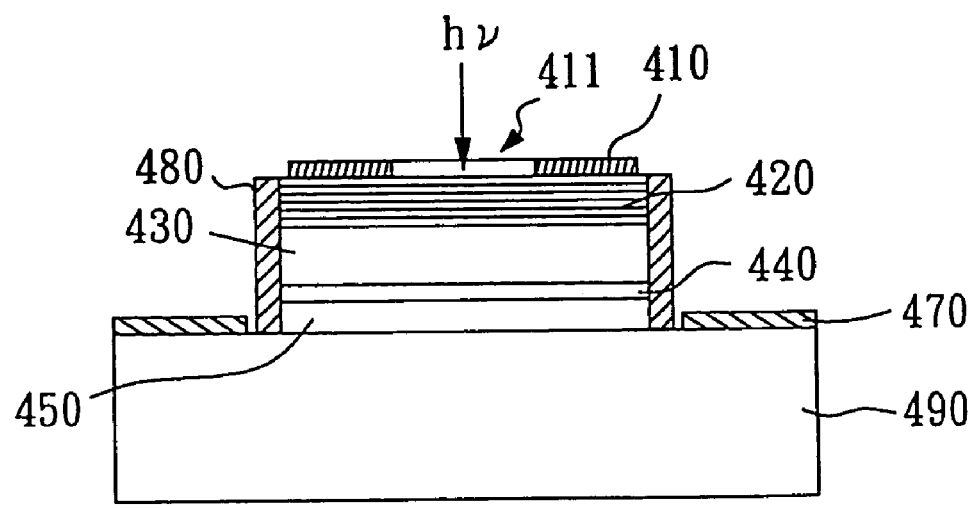
FIG. 4 is a cross-sectional view of another embodiment according to the invention.

Refer to FIGS. 1 and 4. FIG. 1 is a view of an energy band diagram of APD of the present invention formed of Si and SiGe alloy. FIG. 4 is a cross-sectional view of an APD example according to the invention. The APD has p-type metal conduction layers 110, 410, absorption layers 120, 420, drift layers 130, 430, electric field shield layers (or shield buffer layers) 140, 440, upper-and-lower waveguide cladding layers 160, 180, multiplication layers 150, 450, and n-type metal conduction layers 170, 470. The absorption layer 120, 420 of the APD of the present embodiment is formed through strain-compensation method and graded doping (i.e. the concentration of dopants varied according to the thickness of the layer) The APD uses SiC as tensile strain layer 122 and SiGe as compressed strain layer 121 when growing Si substrate. The two grown epitaxy layers form interlaced splice superlattice to obtain strain balance effect and further increase thickness of the epitaxy layers. The absorption layer 120 with graded doping growth can form a built-in electric field to increase electron transport speed and thus shorten electron transport time in the absorption layer 120. The SiC/SiGe quantum well or superlattice based detector has small band offset and does not block electron transport, thus shorter electron transport time is predictable. As compared the device of FIG. 1 and a prior quantum well or superlattice photodetector with Si substrate, the device of FIG. 1 can relatively be improved in its speed. Because the absorption layer of FIG. 1 is p-type graded doping and has appropriate design of superlattice structure, photo-generated hole directly relax to a contact surface in a time of sub-picosecond order and does not limit the device's response speed. The device design in FIG. 1 can thus overcome the problem of holes accumulation in a general SiC/SiGe quantum well or superlattice based detector due to large valence band offset. The device of FIG. 1 uses a graded doped structure to produce a built-in electric field and thus speed up electron transport, such that carrier transport problem is overcome completely and the invention has giga-capability (>40 GHz) at low-gain operation. The device of FIG. 1 only involves electron transport, which can result in an advantage of increasing the maximum output power of the device. Because the epitaxy structure of the device is very similar to a SiGe-based DHBT (Double Hetero-structure Bipolar Junction Transistor) without emitter, they can be integrated and formed on the same substrate, thereby creating Si-based OEIC (optoelectronic integrated circuit).

When comparing this embodiment and a conventional APD structure, the most difference is that an additional undoped drift layer 130 (such as Si epitaxy or SiGe epitaxy with graded bandgap) is arranged in the epi-layer structure. The drift layer 130 has wider bandgap energy than absorption layer 120 and essentially reduces device capacitance and provides required electric field for quickly sweeping out electrons in order to relatively increasing the device's operating speed. In this embodiment, the drift layer 130 is an undoped Si layer. The electric field shield layer (or field buffer layer) 140 uses epitaxy growth doping or ion implanting to form a layer of semiconductor material with identical re-doping type (p type or n type) and wider bandgap than absorption layer 120, i.e., an electric field buffer layer, thereby preventing the avalanche from the absorption layer 120 and the drift layer 130. In this embodiment, the electric field shield layer (or field buffer layer) 140 is p-type (or n-type) doped Si layer. While operating the device of FIG. 1, electric field is concentrated in a thinner multiplication layer 150 due to the field buffer layer 140, thus an operating voltage can be effectively reduced. As cited, since the absorption layer and the multiplication layer have improved structures, the device of FIG. 1 or FIG. 4 can have advantages of low operating voltage, high speed, high saturation power, high gain-bandwidth product, low dark current, low noises and the like.

Refer to FIGS. 2 and 4. FIG. 2 is a view of an energy band diagram of another embodiment of APD formed of group III-V materials according to the invention. The APD has a p-type waveguide cladding layer 210, an absorption layer 220, a drift layer 230, an electric field shield layer (or field buffer layer) 240, a multiplication layer 250, an n-type waveguide cladding layer 260, an n-type metal contact layer 280 and a p-type metal contact layer 270. In this embodiment, the APD uses InAlAs as the multiplication layer 250 because the number of electrons is much greater than the number of holes when multiplication avalanche occurs in InAlAs, which is an excellent property similar to Si material. In this embodiment, the transport layer (or the drift layer) 230 uses undoped InP material because it has no response to wavelength of optical communication and has very high electron mobility, which can effectively reduce the device's capacitance and reduce electron transport time. In this embodiment, the absorption layer 220 uses InGaAs material because InGaAs material has strong absorption and high electron mobility for operating wavelength of optical communication. In addition, InGaAs material also has graded doping to produce a built-in electric field, which can accelerate the carriers (such as electrons). In this embodiment, electron stop layer 212 is InGaAsP because it can avoid electron diffusion to the p-type waveguide cladding layer 210. The electric field shield layer (or field buffer layer) 240 uses epitaxy growth doping or ion implanting to form a layer of graded bandgap InAlAs semiconductor material with identical doping type (p type or n type) and wider bandgap than absorption layer 220, i.e., electric field buffer layer, thereby preventing the avalanche from the absorption 220 and the drift layer 230. For the waveguide of the incident light, this embodiment uses InAlAs, InAlGaAs or InGaAs, which has lower refractive index than InGaAs and InP, to form the waveguide cladding layers 210 and 260. Structure and operation of this embodiment are similar to those of the preceding embodiment, except for III-V based semiconductor materials used in this embodiment.

Refer to FIG. 3. Another embodiment shown in FIG. 3 has the same layer structure as that of FIG. 1. However, re-growth is used in side wall of the quantum well to form hole relaxation layer 322 having an energy bandgap equal to or smaller than bandgap of energy well's material used in the quantum well, such that holes are relaxed to the well's surface through transverse relaxation propagation. Accordingly, when the quantum well's potential barrier layer of the absorption layer 320 sometimes needs thicker, the problem that holes cannot be relaxed to external contact due to capture is overcome. In this embodiment, the hole relaxation layer 322 is $P^+$—Ge or $P^+$—SiGe.

Refer to FIG. 4, an embodiment shown in FIG. 4 has layer structure similar to that of FIG. 1 (no optical guiding cladding layers 160 and 180). However, the embodiment is implemented on $n^+$—Si substrate 490 using simple etch mesa plus vertically incident structure. The APD shown in FIG. 4 has p-type circular metal 410, absorption layer 420, drift layer 430, electric field shield layer (or field buffer layer) 440, multiplication layer 450 and n-type ring circular metal 470. Epitaxy structure required by the APD of FIG. 4 can be formed on $n^+$—Si substrate by using UHV-CVD, LP-CVD or MBE. $SiO_2$ or PMGI passivation layer 480 is optionally applied to lateral part of the device on the etch mesa, so as to reduce dark current or lateral avalanche. In this embodiment, $n^+$or $p^+$circular metals 410 and 470 are co-planar to profit high-speed measurement of device. Light signal is incident from a hole 411 in front (or top) of device.

Figure 5:
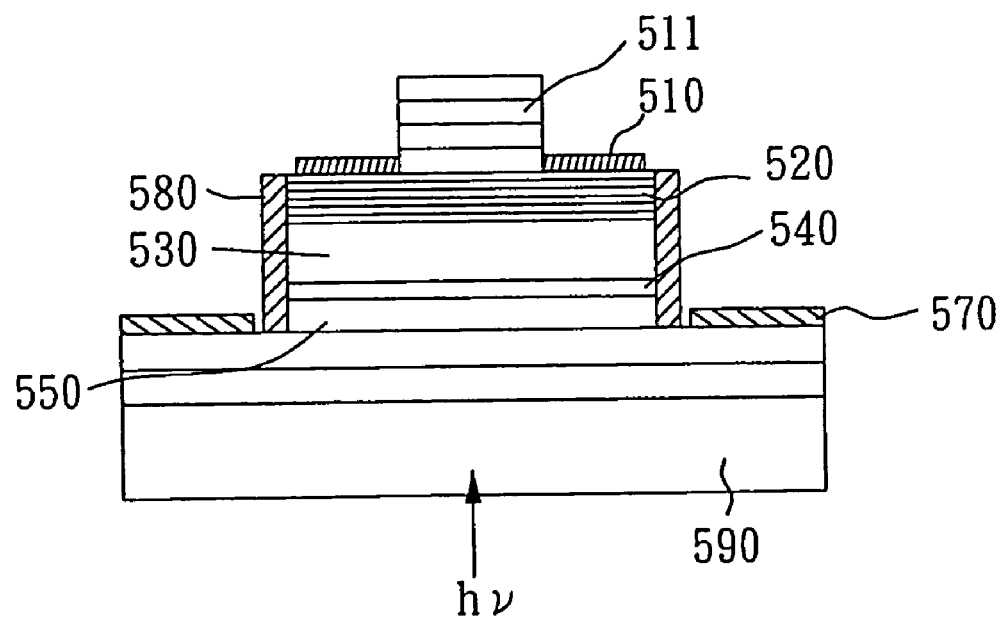
FIG. 5 is a cross-sectional view of another embodiment according to the invention.

Refer to FIG. 5. The APD of this embodiment shown in FIG. 5 has p-type metal conduction layer 510, multi-layer distributed Bragg reflector 511, absorption layer 520, drift layer 530, electric field shield layer (or field buffer layer) 540, multiplication layer 550 and n-type metal conduction layer 570. FIG. 4 has the same layer structure as FIG. 1. However, required epitaxy and device structure of FIG. 4 are formed on SOI (Silicon-On-Insulator) substrate 590. CVD or electron beam evaporation is applied in the absorption layer 520 to plate with the multi-layer distributed Bragg reflector 511 having high reflection at operating wavelength. Accordingly, when the light signal from bottom of the substrate 590 passes through semi-reflective $SiO_2$ layer, optical resonance is formed, so as to completely absorb the light signal in the resonant cavity. Therefore, quantum efficiency of the detector is increased. The epitaxy thickness for the device is designed to meet with integer multiplication of ($\frac{1}{2}$)$\lambda$ of the resonant light.

Figure 6:
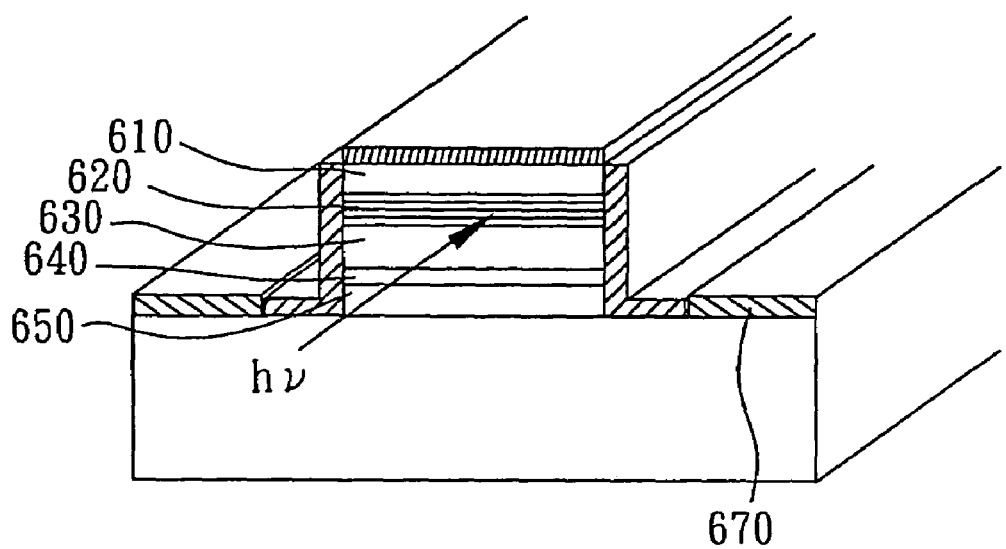
FIG. 6 is a cross-sectional view of another embodiment according to the invention.
Figure 7:
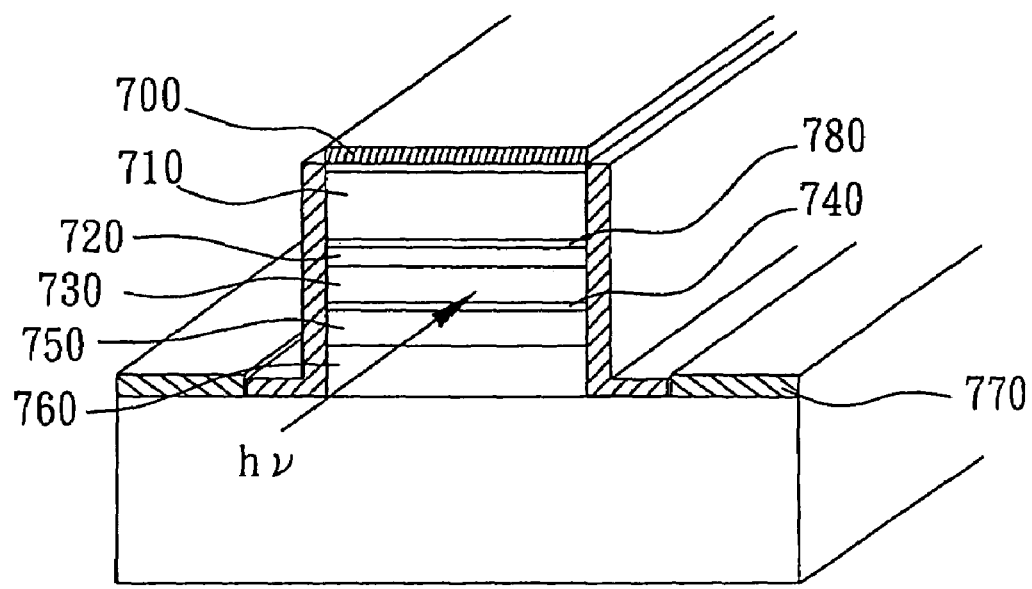
FIG. 7 is a cross-sectional view of another embodiment with III-V alloy materials according to the invention.

Refer to FIGS. 6 and 7, another embodiments shown in FIGS. 6 and 7 have layer structures similar to that shown in FIG. 4, except that the optical guiding cladding layers 160, 180, 210 and 260 shown in FIGS. 1 and 2 are implemented due to their edge-coupled traveling-wave detector structures. The APD of FIG. 6 has p-type optical cladding layer 610, absorption layer 620, drift layer 630, electric field shield layer (or field buffer layer) 640, multiplication layer 650 and n-type metal conduction layer 670. The III-V based APD of FIG. 7 has p-type optical cladding layer 710, p-type metal contact layer 700, absorption layer 720, drift layer 730, electric field shield layer (field buffer layer) 740, multiplication layer 750, n-type optical cladding layer 760, n-type conduction layer 770 and p-type electron stop layer 780. The structure with the waveguide can obtain the optimal gain-bandwidth product by adjusting the device's length. As cited, the APD can be the structure of generally vertical incidence device such that the transport direction of photo-generated carriers parallels to the direction of incident light and epitaxy. CVD or evaporation is applied in surfaces and bottoms of photo-absorption layer, electric field buffer layer, drift layer and multiplication layer in order to form the multi-layer Bragg reflector with resonant reflection on SOI substrate. For traveling-wave structure, the device's epitaxy forms optical waveguide for guiding the incident light and its electrodes are arranged in the structure of electrical transmission line.

Figure 8:
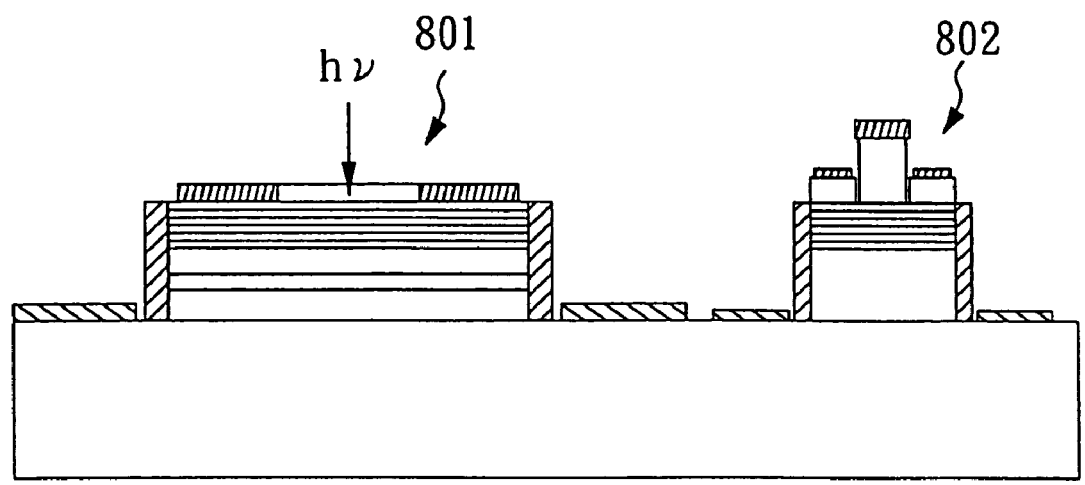
FIG. 8 is a cross-sectional view of integrating a bipolar transistor and an embodiment of the invention on Si substrate.
Figure 9:
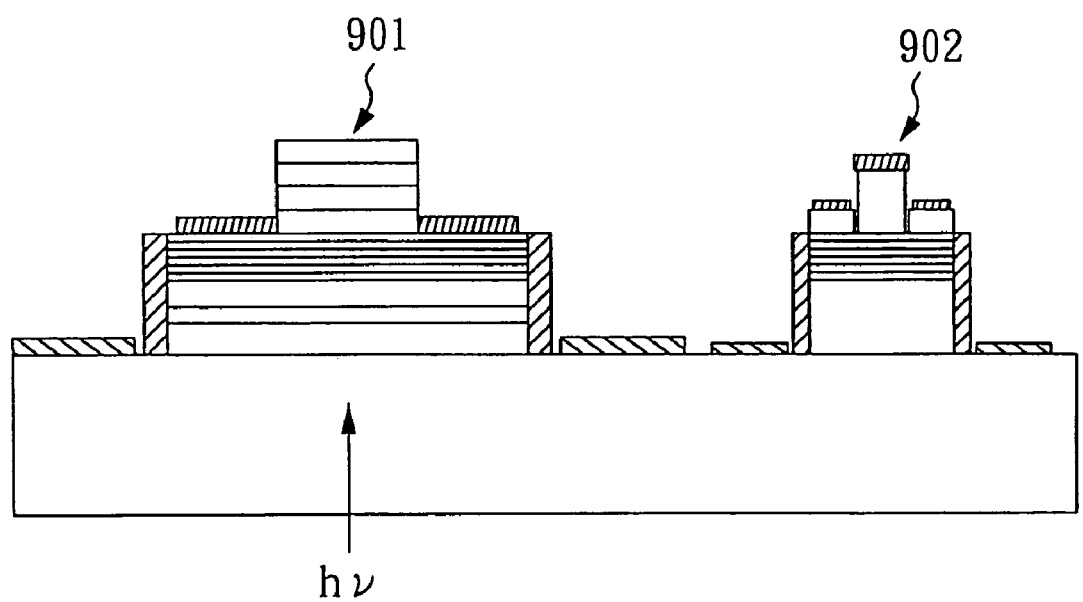
FIG. 9 is a cross-sectional view of integrating a bipolar transistor and another embodiment of the invention on silicon on insulator (SOI) SOI substrate.

For system integration, the inventive photodetector can use re-growth or pre-formation to obtain a semiconductor layer with wider energy bandgap than and a doped type opposite to the lower absorption layer. The semiconductor layer is regarded as emitter or collector of DHBT, thereby monolithically integrating with other DHBTs or circuits formed by DHBTs. The electric field buffer layer of APD can be formed by ion implantation. III-V, III-V alloy, IV or IV alloy semiconductor materials can be applied in DHBT and APD integration. As shown in FIGS. 8 and 9, the process applies Si and IV alloy semiconductor to structures of vertical incidence device and resonantly vertical incidence device for implementing APDs 801 and 901 and DHBTs 802 and 902 on heavily doped Si substrate or SOI substrate.

Although the present invention has been explained in relation to its preferred embodiment, it is to be understood that many other possible modifications and variations can be made without departing from the spirit and scope of the invention as hereinafter claimed.

What is claimed is:

1. An avalanche photodetector (APD), comprising:
    an absorption layer, which is made of a first semiconductor for absorbing an incident light and converting the incident light into carriers; wherein said absorption layer is graded heavily doped or heavily doped;
    a multiplication layer, which is made of an undoped second semiconductor for multiplying currents by receiving and accumulating the carriers;
    a field buffer layer, which is made of a third semiconductor sandwiched between the absorption layer and the multiplication layer for concentrating an electric field in the multiplication layer when a bias voltage is applied; and
    a drift layer, which is made of an undoped fourth semiconductor sandwiched between the field buffer layer and the absorption layer for reducing capacitance.

2. The APD as claimed in claim 1, further comprising a first conduction layer and a second conduction layer, wherein the absorption layer is sandwiched between the first conduction layer and the drift layer and the multiplication layer is sandwiched between the second conduction layer and the field buffer layer.

3. The APD as claimed in claim 1, further comprising a first waveguide layer and a second waveguide layer, wherein the absorption layer is sandwiched between the first waveguide layer and the drift layer and the multiplication layer is sandwiched between the second waveguide layer and the field buffer layer.

4. The APD as claimed in claim 1, further comprising a first multi-layer reflector set and a second layer of reflector set, wherein the absorption layer and the multiplication layer are sandwiched between the first multi-layer reflector set and the second layer of reflector set.

5. The APD as claimed in claim 2, further comprising a side wall hole relaxation layer to contact around the absorption layer and link the absorption layer and the first conduction layer for catching and relaxing hole of the absorption layer to the first conduction layer.

6. The APD as claimed in claim 1, wherein the absorption layer is a superlattice with repeatedly interlaced multi-layer strain balance.

7. The APD as claimed in claim 1, wherein the absorption layer, the multiplication layer, the field buffer layer, the drift layer all are semiconductor of elements of group IV in periodic table or alloy semiconductor of elements of group IV in periodic table.

8. The APD as claimed in claim 1, wherein the absorption layer, the multiplication layer, the field buffer layer, the drift layer all are III-V based semiconductor or III-V based semiconductor alloy.

9. The APD as claimed in claim 1, wherein the absorption layer is p-type or n-type graded heavily doping or heavily doping SiGe, SiGeC, SiC/SiGe multi-layer superlattice, Si/SiGe multi-layer superlattice or Si/Ge quantum dot.

10. The APD as claimed in claim 1, wherein the multiplication layer is undoped Si layer, the drift layer is undoped Si layer, and the field buffer layer is p-type or n-type heavily doped Si layer.

11. The APD as claimed in claim 1, wherein the absorption layer is p-type InGaAs, the drift layer is undoped InP, the field buffer layer is p-type graded bandgap InAlAs, and the multiplication layer is undoped InAlAs.

12. The APD as claimed in claim 4, wherein the first multi-layer reflector set and the second layer of reflector set are distributed Bragg reflector.

13. The APD as claimed in claim 5, wherein the hole relaxation layer is P+—Ge or P+—SiGe.

14. The APD as claimed in claim 3, wherein an incident direction of the incident light and an average propagation direction of the carriers are vertical or almost vertical.

15. The APD as claimed in claim 2, wherein an incident direction of the incident light and an average propagation direction of the carriers are parallel or almost parallel.

16. The APD as claimed in claim 4, wherein an incident direction of the incident light and an average propagation direction of the carriers are parallel or almost parallel.

17. The APD as claimed in claim 5, wherein an incident direction of the incident light and an average propagation direction of the carriers are parallel or almost parallel.

18. The APD as claimed in claim 1, wherein an APD including the absorption layer, the multiplication layer, the field buffer layer and the drift layer is formed by UHV-CVD, LP-CVD or MBE.

19. The APD as claimed in claim 1, wherein an APD including the absorption layer, the multiplication layer, the field buffer layer and the drift layer is formed on SOI (Silicon-On-Insulator) by UHV-CVD, LP-CVD or MBE.

* * * * *